United States Patent [19]
Kunori et al.

[11] Patent Number: 5,538,912
[45] Date of Patent: Jul. 23, 1996

[54] METHOD OF MAKING MEMORY CELLS WITH PERIPHERAL TRANSISTORS

[75] Inventors: Yuichi Kunori; Natsuo Ajika; Hiroshi Onoda; Makoto Ohi; Atsushi Fukumoto, all of Hyogo, Japan

[73] Assignee: Mitsubishi Denki Kabushiki Kaisha, Tokyo, Japan

[21] Appl. No.: 370,755

[22] Filed: Jan. 10, 1995

Related U.S. Application Data

[62] Division of Ser. No. 114,229, Sep. 1, 1993, Pat. No. 5,400,278.

[30] Foreign Application Priority Data

Feb. 1, 1993 [JP] Japan .................... 5-14888

[51] Int. Cl.[6] ............................. H01L 21/8247
[52] U.S. Cl. ............................. 437/43; 437/52
[58] Field of Search .................... 437/43, 48, 52

[56] References Cited

U.S. PATENT DOCUMENTS

| | | | |
|---|---|---|---|
| 4,829,361 | 5/1989 | Sagara et al. | |
| 4,849,366 | 7/1989 | Hsu et al. | 437/42 |
| 4,907,058 | 3/1990 | Sakai. | |
| 5,175,120 | 12/1992 | Lee | 437/48 |
| 5,183,773 | 2/1993 | Miyata | 437/52 |
| 5,352,620 | 10/1994 | Komori et al. | 437/52 |

FOREIGN PATENT DOCUMENTS

| | | |
|---|---|---|
| 61-191052 | 8/1986 | Japan. |
| 3-74872 | 3/1991 | Japan. |

*Primary Examiner*—Mary Wilczewski
*Assistant Examiner*—Richard A. Booth
*Attorney, Agent, or Firm*—Lowe, Price, LeBlanc & Becker

[57] ABSTRACT

In a semiconductor memory device according to the present invention, a conductive layer is formed on a field oxide film in a boundary region on the main surface of a semiconductor substrate. A floating gate electrode, an interlayer insulating film, and a control gate electrode are formed on the semiconductor substrate in a memory cell array region with a gate insulating film interposed therebetween. A gate electrode is formed in a peripheral circuit region with the gate insulating film interposed therebetween. An interlayer insulating film is formed on the conductive layer, the gate electrode, and the control gate electrode. A contact hole is formed at a predetermined position of the interlayer insulating film. An interconnection layer is selectively formed on the interlayer insulating film including the inner surface of the contact hole. According to the present invention, it is possible to prevent formation of a concave portion on the surface of the field oxide film in the boundary region. It is also possible to protect the memory cell array region from an external noise by forming the conductive layer on the field oxide film in the boundary region and by fixing the potential of the conductive layer.

5 Claims, 17 Drawing Sheets

MEMORY CELL ARRAY REGION

BOUNDARY REGION

PERIPHERAL CIRCUIT REGION 5,538,912

METHOD OF MAKING MEMORY CELLS WITH PERIPHERAL TRANSISTORS

This application is a divisonal of application Ser. No. 08/114,229 filed Sep. 1, 1993, now U.S. Pat. No. 5,400,278.

BACKGROUND OF THE INVENTION

1. Field of the Invention

The present invention relates to semiconductor memory devices and a method of manufacturing the same, and more particularly, to a semiconductor memory device which can improve reliability by forming a conductive layer so as to surround a memory cell array region on a boundary region between the memory cell array region and a peripheral circuit region, and a method of manufacturing the same.

2. Description of the Background Art

Conventionally, various studies on a semiconductor memory device have been made. According to characteristics and functions, several kinds of semiconductor memory devices such as ROM, SRAM, DRAM and the like have been developed. Description will be given hereinafter by taking a stacked gate type EPROM (erasable and programmable read only memory) as an example of the semiconductor memory devices.

FIG. 25 is a partial cross sectional view showing a schematic configuration of a conventional stacked gate type EPROM. Referring to FIG. 25, the conventional EPROM includes a memory cell array region in which a memory transistor is formed, a peripheral circuit region in which peripheral circuits carrying out operation control of the memory transistor are formed, and a boundary region formed in a boundary portion between the memory cell array region and the peripheral circuit region. An isolation oxide film or the like is ordinarily formed in the boundary region.

As shown in FIG. 25, field oxide films 52, 52a are spaced on the main surface of a semiconductor substrate 51. A floating gate electrode 56 is formed on the memory cell array region on the main surface of semiconductor substrate 51 with a gate insulating film 53 interposed therebetween. A control gate electrode 58 is formed on floating gate electrode 56 with an interlayer insulating film 57 interposed therebetween. The memory transistor is configured of control gate electrode 58, interlayer insulating film 57 and floating gate electrode 56.

On the other hand, in the peripheral circuit region on the main surface of semiconductor substrate 51, a gate electrode 54 is formed with gate insulating film 53 interposed therebetween. A part of the peripheral circuits is configured of a transistor including gate electrode 54. Field oxide film 52a is formed in the boundary region on the main surface of semiconductor substrate 51. An interlayer insulating film 59 is formed so as to cover the above-described memory transistor, field oxide films 52, 52a and gate electrode 54.

A contact hole 61 is formed at a predetermined position in interlayer insulating film 59. An interconnection layer 60 of aluminum (Al) or the like is selectively formed on interlayer insulating film 59 including the inner surface of contact hole 61.

A method of manufacturing the conventional EPROM having the above-described configuration will now be described with reference to FIGS. 26 to 30. FIGS. 26 to 30 are partial cross sectional views showing the first to the fifth steps of the manufacturing process of the conventional EPROM.

Referring to FIG. 26, field oxide films 52, 52a are formed on the main surface of semiconductor substrate 51 by selectively applying a thermal oxidation process. Gate insulating film 53 is formed on the entire main surface of semiconductor substrate 51. Then, a first conductive layer 56a of poly-crystalline silicon or the like having the film thickness of approximately 1000Å to 1500Å is deposited by using a CVD (Chemical Vapor Deposition) method or the like.

First conductive layer 56a is patterned to be left in the memory cell array region. Then, an insulating layer 57a having the film thickness of approximately 300Å of a silicon field film or in a combined structure of a silicon oxide film and a silicon nitride film is formed on first conductive layer 56a. A second conductive layer 55a of poly-crystalline silicon or the like having the film thickness of approximately 2000 Å to 3000 Å is deposited on insulating layer 57a, on field oxide film 52a positioned in the boundary region, and on the peripheral circuit region by using the CVD method or the like.

A first mask layer 66 of resist or the like is applied to second conductive layer 55a. As shown in FIG. 27, first mask layer 66 is patterned to have a portion covering the memory cell array region and having an end portion 66a on field oxide film 52a in the boundary region, and portions selectively formed in the peripheral circuit region. Referring to FIG. 28, by applying an etching process with first mask layer 66 used as a mask, gate electrode 54 is formed in the peripheral circuit region. Then, first mask layer 66 is removed.

A second mask layer 67 of resist or the like is applied to the entire main surface of semiconductor substrate 51. Then, second mask layer 67 is patterned. As a result, as shown in FIG. 29, second mask layer 67 is formed having a portion covering the peripheral circuit region and having an end portion 67a on field oxide film 52 in the boundary region, and portions selectively formed on second conductive layer 55a in the memory cell array region.

Second mask layer 67 is patterned so that end portion 67a of second mask layer 67 positioned on field oxide film 52a formed in the boundary region is not positioned over second conductive layer 55a extending over field oxide film 52a formed in the boundary region.

Description will be given to the reason why end portion 67a of second mask layer 67 is formed not to be positioned over second conductive layer 55a on field oxide film 52a.

Even if second conductive layer 55a is left in the boundary region, second conductive layer 55a does not serve as an interconnection layer. Therefore, it was not considered that it is preferred that second conductive layer 55a not serving as the interconnection layer is left in the boundary region. Therefore, patterning was carried out so that end portion 66a of first mask layer 66 and end portion 67a of second mask layer 67 are positioned with a predetermined space so as not to overlap with each other on field oxide film 52a in the boundary region.

Referring to FIG. 30, by applying an etching process with second mask layer 67 used as a mask, floating gate electrode 56, interlayer insulating film 57, and control gate electrode 58 are formed in the memory cell array region. Then, referring to FIG. 25, interlayer insulating film 59 is formed on the entire main surface of semiconductor substrate 51 by using the CVD method or the like. Contact hole 61 is formed at a predetermined position of interlayer insulating film 59. Interconnection layer 60 of aluminum (Al) or the like is selectively formed on interlayer insulating film 59 including the inner surface of contact hole 61 by using a sputtering method or the like. The conventional EPROM shown in FIG. 18 is formed in the above-described steps.

However, a semiconductor memory device represented by the conventional EPROM had the following problems, which will be described with reference to FIGS. 30 and 31. FIG. 31 is a partial cross sectional view showing in the same figure first mask layer 66 and second mask layer 67 used in the manufacturing process of the conventional EPROM. Therefore, a portion 69a on the memory cell array region in which second mask layer 67 is positioned over first mask layer 66, and a portion 69b on the peripheral circuit region in which first mask layer 66 is positioned over second mask layer 67 are shown in FIG. 31.

As shown in FIG. 31, end portion 66a of first mask layer 66 and end portion 67a of second mask layer 67 on field oxide film 52a in the boundary region are formed so as not to overlap with each other. It was for preventing a remainder of second conductive layer 55a from being formed on field oxide film 52a in the boundary region, as described above.

An etching process is sequentially applied with first and second mask layers 66, 67 used as masks. As show in FIG. 30, when forming floating gate electrode 56, interlayer insulating film 57, and control gate electrode 58, a concave portion 68 is formed on field oxide film 52a in the boundary region.

The depth of concave portion 68 depends on the etching conditions. However, when the film thickness of first conductive layer 56a is approximately 1000Å to 1500Å, the film thickness of insulting layer 57a is approximately 300Å, the film thickness of second conductive layer 55a is approximately 2000Å to 3000Å, and the film thickness of field oxide films 52, 52a is approximately 4000Å to 5000Å, as described above, concave portion 68 of depth of more than approximately 1000Å to 2000Å may be formed.

By formation of concave portion 68, it is considered that the upper interconnection layer formed so as to extend over field oxide film 52 may be disconnected. Due to formation of concave portion 68, occurrence of leakage current is also possible. Since the depth of concave portion 68 may be larger depending on the etching conditions, the above-described problems become more serious.

On the other hand, it is considered that positions of end portions 66a, 67a of first and second mask layers 66, 67 are adjusted so that concave portion 68 causing the above-described problems will not be formed. However, in order to pattern first mask layer 66 and second mask layer 67 so that concave portion 68 will not be formed, it is necessary to match positions of end portion 66a of first mask layer 66 and end portion 67a of second mask layer 67. In order to achieve this, patterning of high accuracy is required, implementation of which is considered to be very difficult.

By patterning first and second mask layers 66, 67 as described above, there is a high possibility that second conductive layer 55a of a critical dimension is left on field oxide film 52a. When second conductive layer 55a of a critical dimension is left on field oxide film 52a, separation of second conductive layer 55a therefrom may damage the semiconductor, possibly causing reliability of the semiconductor device to decrease. Therefore, formation of concave portion 68 has conventionally been inevitable.

Other than the above-described problems, a semiconductor memory device such as the conventional EPROM also has the following problems. It is considered that a power supply potential applied to a semiconductor chip will be of a small value in the future. Accordingly, an internal electric field in the memory cell array region, for example, will be weak. As a result, there is a possibility that an influence of an external noise on the inside of the memory cell array region cannot be ignored.

However, in the semiconductor memory device such as the conventional EPROM, a unit for protecting the memory cell array region was not provided. Therefore, in the future, the situation where the influence of the external noise cannot be ignored is also possible.

SUMMARY OF THE INVENTION

One object of the present invention is to provide a semiconductor memory device which can improve reliability by including a unit for protecting a memory cell array region from an external noise, and a method of manufacturing the same.

Another object of the present invention is to provide a semiconductor memory device which can improve reliability by preventing formation of a concave portion on the surface of the field oxide film caused by the same formed in a boundary region etched locally, and a method of manufacturing the same.

The semiconductor memory device according to the present invention includes a memory cell array region storing information, a peripheral circuit region carrying out operation control of the memory cell array region, an isolation oxide film provided in a boundary region between the memory cell array region and the peripheral circuit region, a conductive layer formed on the isolation oxide film for protecting the memory cell array region from an external noise, and a potential holding unit for holding a potential of the conductive layer at a predetermined potential.

As described above, in the semiconductor memory device according to the present invention, the conductive layer for protecting the memory cell array region from the external noise is provided on the isolation oxide film formed in the boundary region between the memory cell array region and the peripheral circuit region. Because of provision of the conductive layer, it is possible to fix the potential of the memory cell array region, for example, by applying a predetermined potential to the conductive layer. As a result, it is possible to protect the memory cell array region from the external noise.

The method of manufacturing the semiconductor memory device according to the present invention includes a method of manufacturing a semiconductor memory device having, on a semiconductor substrate, a memory cell array region for storing information, a peripheral circuit region for carrying out operation control of the memory cell array region, and an isolation oxide film provided in a boundary region between the memory cell array region and the peripheral circuit region. Then, the method according to the present invention further includes the steps of: forming sequentially a first conductive layer and an insulating layer on the semiconductor substrate in the memory cell array region; forming a second conductive layer on the insulating layer, on the isolation oxide film and on the peripheral circuit region; patterning the second conductive layer on the peripheral circuit region to a predetermined shape with the second conductive layer formed on the memory cell array region and on the isolation oxide film covered with a first mask layer; removing the first mask layer; etching sequentially the second conductive layer, the insulating layer and the first conductive layer on the memory cell array region to pattern the same to a predetermined shape with the second conductive layer on the isolation oxide film and the peripheral circuit region covered with a second mask layer; and removing the second mask layer.

According to the method of manufacturing the semiconductor memory device based on the present invention, when patterning the second conductive layer, the insulating layer, and the first conductive layer on the memory cell array region, the second mask layer is formed so as to cover the second conductive layer on the isolation oxide film and the peripheral circuit region. Therefore, in the step of patterning the second conductive layer on the memory cell array region, part of the surface of the isolation oxide film cannot be exposed. As a result, it is possible to avoid formation of the concave portion on the surface of the isolation oxide film caused by the surface of the isolation oxide film locally etched. Then, it is possible to avoid various problems such as disconnection of the upper interconnection layer, occurrence of leakage current and the like caused by formation of the concave portion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
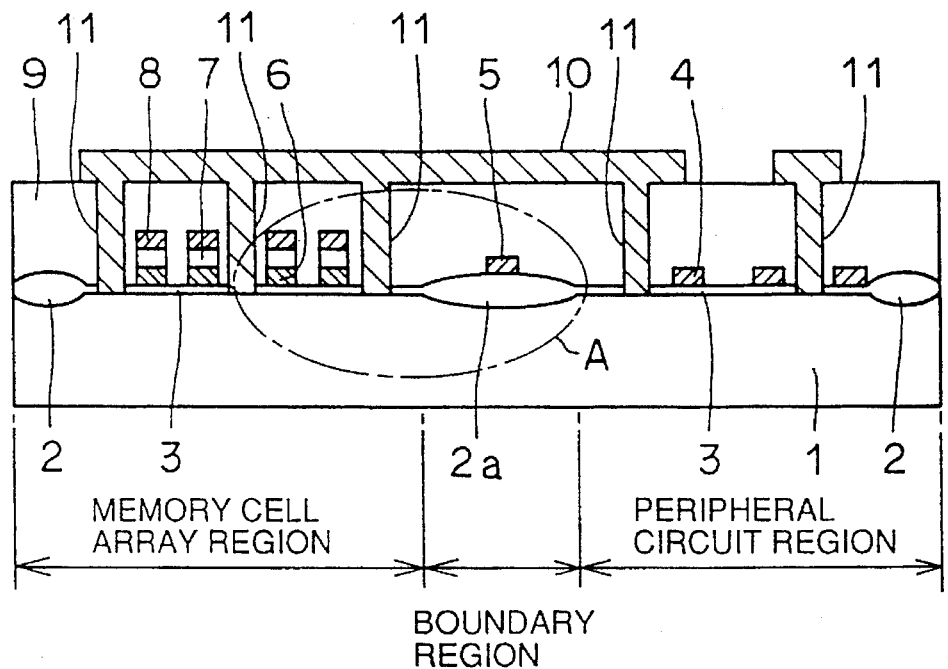
FIG. 1 is a partial cross sectional view showing a semiconductor memory device according to a first embodiment of the present invention.
Figure 2:
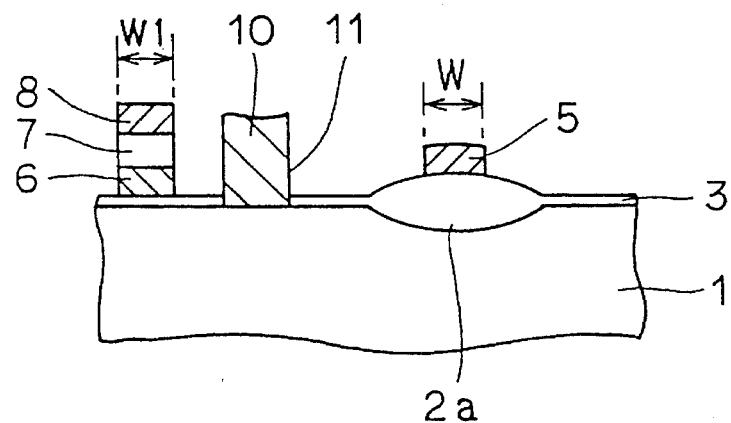
FIG. 2 is a cross sectional view with an A region of FIG. 1 enlarged.

Embodiments of the present invention will be described hereinafter with reference to FIGS. 1 to 24. FIG. 1 is a partial cross sectional view of a semiconductor memory device according to the first embodiment of the present invention. FIG. 2 is a cross sectional view with an A region of FIG. 1 enlarged.

Referring to FIG. 1, the semiconductor memory device according to the present invention includes a memory cell array region having a memory transistor formed therein for storing information, a peripheral circuit region in which peripheral circuits are formed for carrying out operation control of the memory transistor formed in the memory cell array region, and a boundary region provided in a boundary portion between the memory cell array region and the peripheral circuit region. Field oxide films 2, 2a are spaced on the main surface of a semiconductor substrate 1. In this figure, field oxide film 2a is formed on the main surface of semiconductor substrate 1 in the boundary region.

A floating gate electrode 6 is formed on the main surface of semiconductor substrate 1 in the memory cell array region with a gate insulating film 3 interposed therebetween. An interlayer insulating film 7 is formed on floating gate electrode 6. A control gate electrode 8 is formed on interlayer insulating film 7. Control gate electrode 8, interlayer insulating film 7, and floating gate electrode 6 configure the memory transistor.

A gate electrode 4 is formed on the main surface of semiconductor substrate 1 in the peripheral circuit region with gate insulating film 3 interposed therebetween. A part of the peripheral circuits is configured of a transistor including gate electrode 4. In the semiconductor memory device according to the present invention, a conductive layer 5 is formed on field oxide film 2a formed on the main surface of semiconductor substrate 1 in the boundary region.

A potential holding unit (not shown) is connected to conductive layer 5. The potential of conductive layer 5 is held at a predetermined potential by the potential holding unit. As a result, it is possible to substantially decrease the influence of the external noise for a memory cell array region 12.

Conductive layer 5 will now be described in detail with reference to FIG. 2. Referring to FIG. 2, a plan width W of conductive layer 5 formed on the surface of field oxide film 2a in the boundary region is set to a value substantially identical to a value of a plan width W1 of control gate electrode 8, interlayer insulating film 7 or floating gate electrode 6 formed in the memory cell array region, in this case.

However, the plan width W of conductive layer 5 is not limited to the value, but may be a value of at least the minimum width of an interconnection layer in a semiconductor chip in which conductive layer 5 is formed. One of the elements which determine the value of the plan width W of conductive layer 5 is that conductive layer 5 may remain on field oxide film 2a without being separated therefrom. Currently, if the width W is a value of at least the minimum width of the interconnection layer formed in the semiconductor chip, specifically, approximately 0.6 μm or more, conductive layer 5 may remain on field oxide film 2a without being separated therefrom. Conductive layer 5 may be formed at any position on the isolation oxide film in the boundary region.

Figure 3:
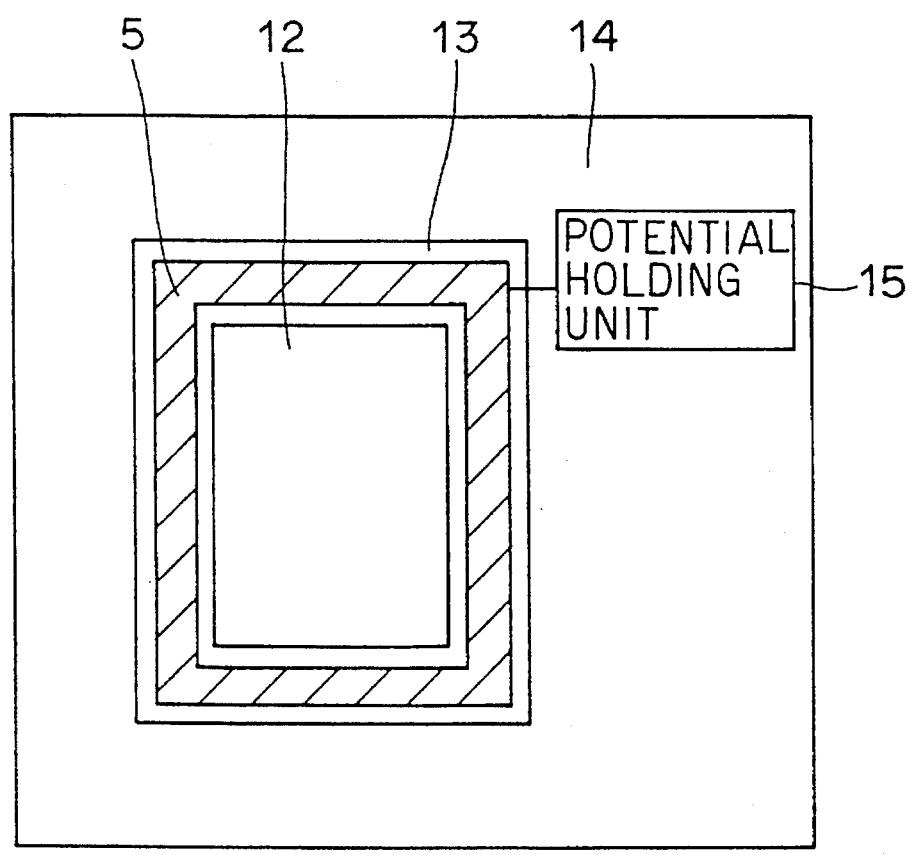
FIG. 3 is a partial plan view showing schematically the semiconductor memory device according to the first embodiment of the present invention.

With reference to FIG. 3, a plan structure of conductive layer 5 will be described. FIG. 3 is a partial plan schematic diagram showing the manner in which conductive layer 5 is formed in a boundary region 13 of the semiconductor memory device. Referring to FIG. 3, boundary region 13 is formed so as to surround memory cell array region 12.

Conductive layer 5 is formed on boundary region 13 which is formed so as to surround memory cell array region 12. As a result, conductive layer 5 is also formed in a circular manner so as to surround memory cell array region 12.

On the circumference of boundary region 13, there exists a peripheral circuit region 14 in which peripheral circuits are formed. In the manner shown in FIG. 3, as an example of conductive layer 5 serving to protect memory cell array region 12, a potential holding unit 15 is formed in peripheral circuit region 14. Potential holding unit 15 is connected to conductive layer 5.

Conductive layer 5 may be held at a predetermined potential by potential holding unit 15. As a result, it is possible to substantially fix the potential of memory cell array region 12 at a predetermined potential, making it possible to protect memory cell array region 12 from the external noise. Potential holding unit 15 has a structure in which conductive layer 5 may be held at $0_V$ or at a negative potential, in this embodiment.

Referring to FIGS. 4 to 10, more specific description will be given to potential holding unit 15. FIGS. 4 to 8 are plan views showing schematically various manners of potential holding unit 15. Description is given to the various manners of potential holding unit 15 in the case where the present invention is applied to a CMOS (Complementary Metal Oxide Semiconductor) structure. However, the present invention is not limited thereto, but may be applied to the cases where the other devices are formed.

Figure 4:
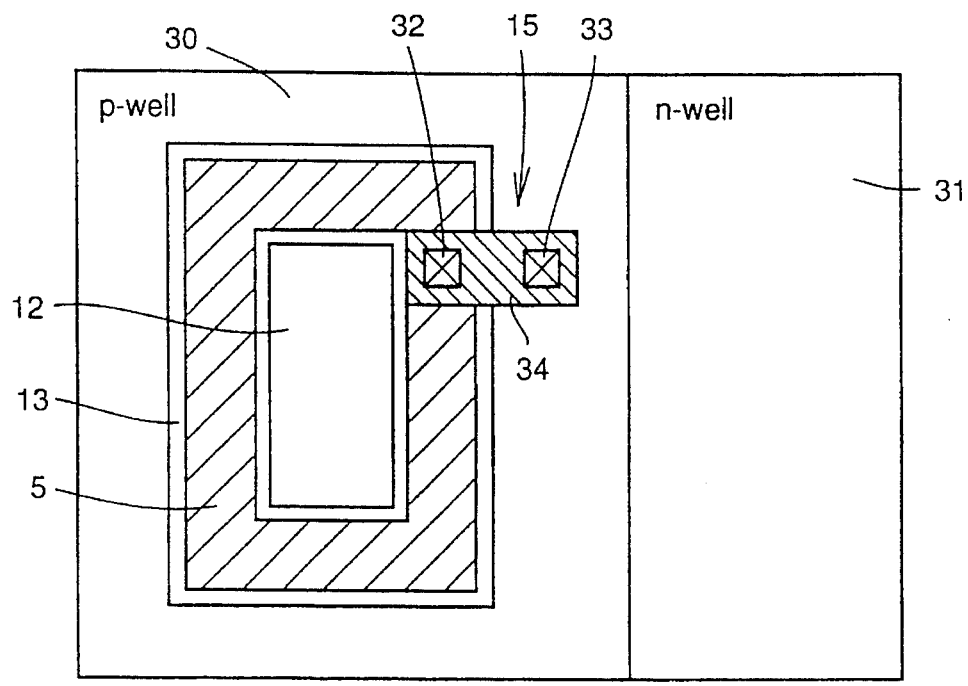
FIGS. 4 to 8 are plan views showing schematically a first to a fifth manners of a potential holding unit according to the present invention.

With reference to FIG. 4, a first manner of potential holding unit 15 will be described. Referring to FIG. 4, memory cell array region 12 is formed on a p well 30. An n well 31 is formed adjacent to p well 30. A twin well structure, so to speak, of CMOS is formed. Boundary region 13 is formed on p well 30. Conductive layer 5 is formed on boundary region 13.

Conductive layer 5 and p well 30 are electrically connected by potential holding unit 15. As a result, conductive layer 5 is held at the same potential as that of p well 30. Potential holding unit 15 includes an aluminum (Al) interconnection 34 electrically connecting conductive layer 5 and p well 30, a first contact portion 32 electrically connecting conductive layer 5 and aluminum interconnection 34, and a second contact portion 33 electrically connecting p well 30 and aluminum interconnection 34.

As described above, by holding conductive layer 5 and p well 30 at the same potential by potential holding unit 15, it is possible to fix the potential of memory cell array region 12. As a result, it is possible to protect the memory cell array region from the external noise.

Figure 5:
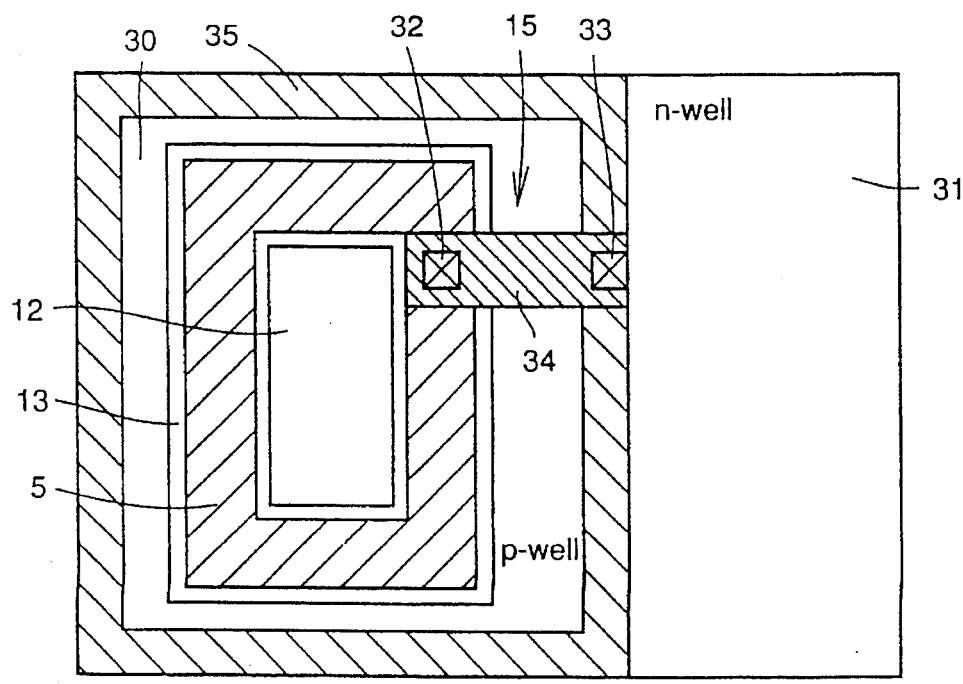

Referring to FIG. 5, a second manner of potential holding unit 15 will now be described. In this manner, a guard ring 35 is formed around p well 30. Guard ring 35, which is an n type impurity region of a high concentration, is provided for reducing the noise. Guard ring 35 and conductive layer 5 are electrically connected by potential holding unit 15. As a result, it is possible to hold the potential of conductive layer 5 at a predetermined potential.

Figure 6:
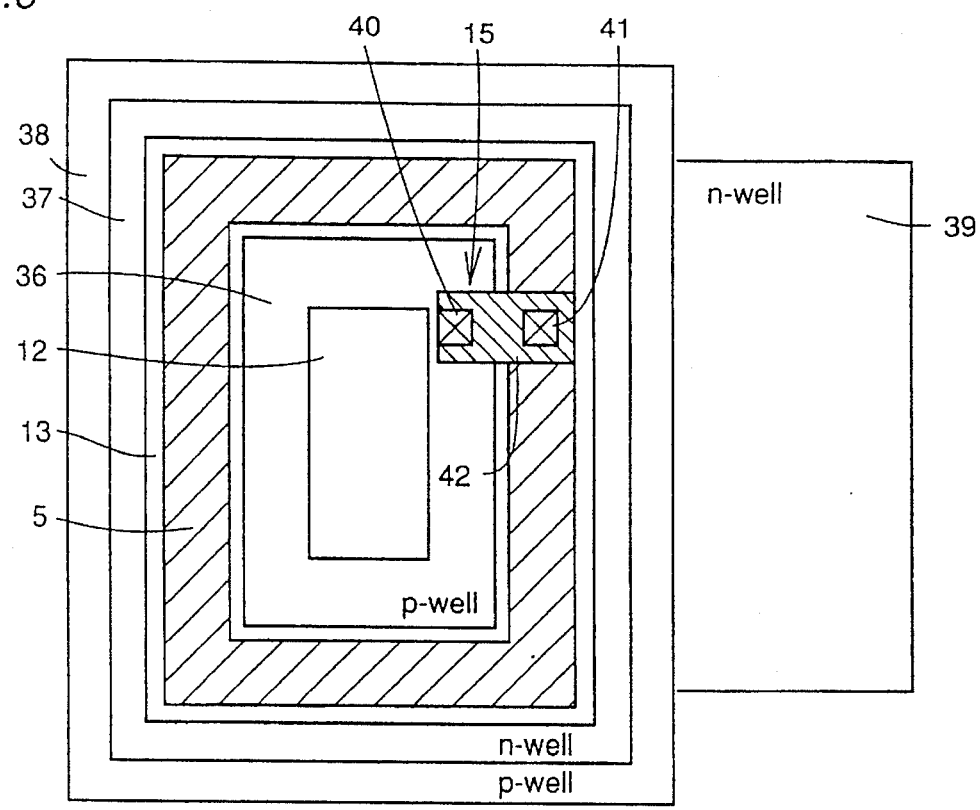

Referring to FIG. 6, a third manner of potential holding unit 15 will be described. In this manner, memory cell array region 12 is formed in a first p well 36. An n well 37 is formed so as to surround first p well 36. A second p well 38 is formed so as to surround n well 37. An n well 39 is formed adjacent to second p well 38. A triple well structure, so to speak, of CMOS is formed.

As shown in FIG. 6, potential holding unit 15 includes a first contact portion 40, an aluminum interconnection 42, and a second contact portion 41. First p well 36 and aluminum interconnection 42 are electrically connected by first contact portion 40. Conductive layer 5 and aluminum interconnection 42 are electrically connected by second contact portion 41, thereby electrically connecting conductive layer 5 and first p well 36. As a result, it is possible to hold conductive layer 5 and first p well 36 at the same potential. It is therefore possible to fix the potential of memory cell array region 12.

Figure 7:
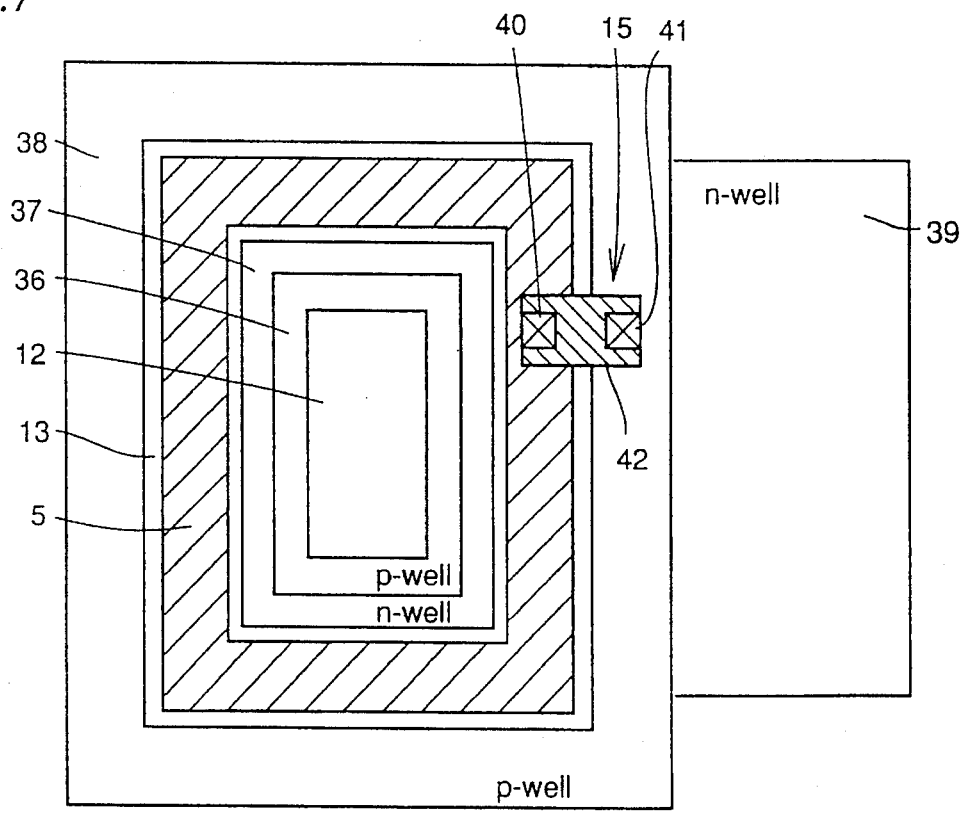

Referring to FIG. 7, a fourth manner of potential holding unit 15 will now be described. In this manner, conductive layer 5 and second p well 38 are electrically connected by potential holding unit 15, thereby making it possible to hold conductive layer 5 and second p well 38 at the same potential. As a result, similar to each case described above, it is possible to fix the potential of memory cell array region 12, whereby it is possible to protect memory cell array region 12 from the external noise.

Figure 8:
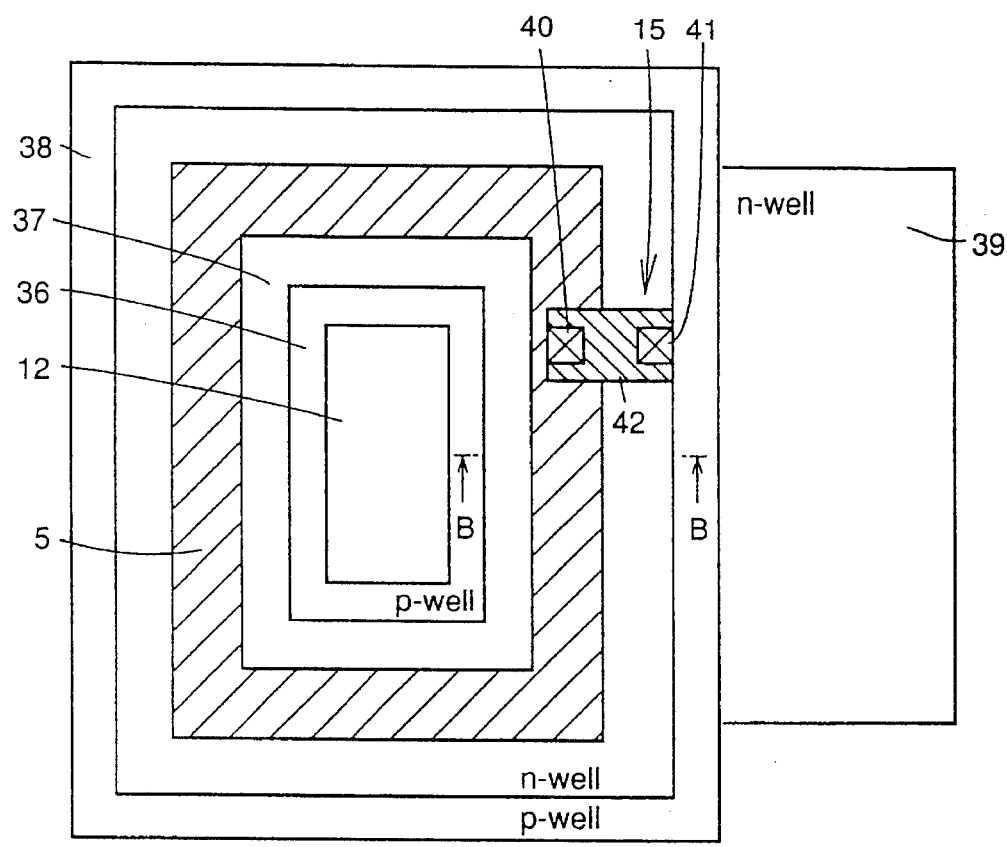

Referring to FIG. 8, a fifth manner of potential holding unit 15 will now be described. In this manner, conductive layer 5 is electrically connected to n well 37. As a result, it is possible to hold conductive layer 5 and n well 37 at the same potential. Since n well 37 is held at the ground potential at this time, it is possible to protect memory cell array region 12 from the external noise similar to the above case.

Figure 9:
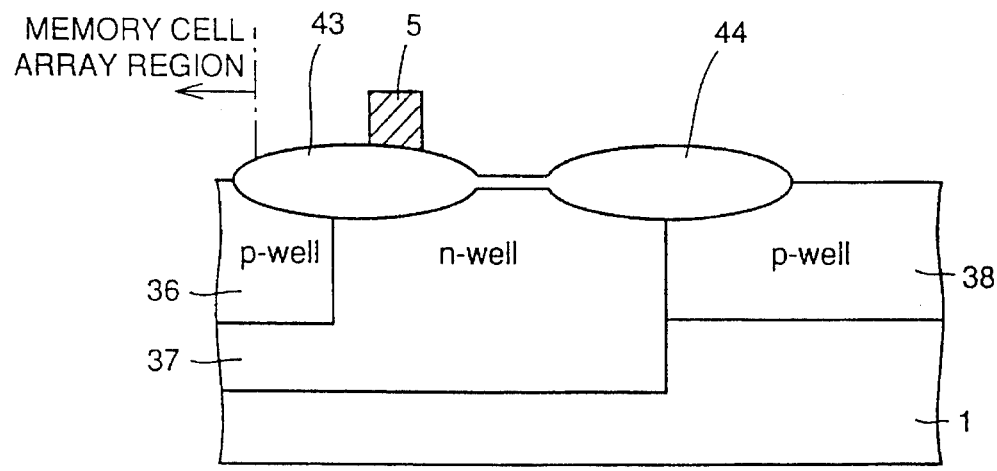
FIGS. 9 and 10 are cross sectional views showing an example of a cross sectional structure taken along a line B—B in FIG. 8.
Figure 10:
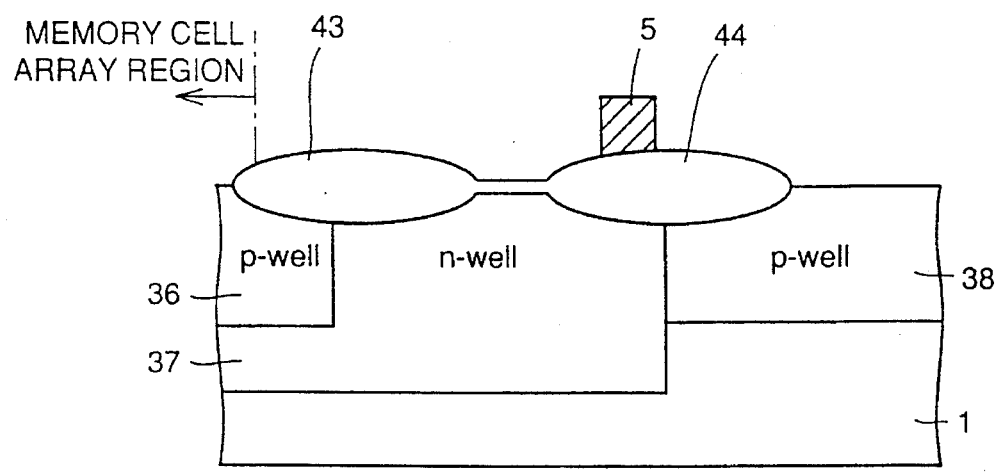

Referring to FIGS. 9 and 10, a structure in the vicinity of conductive layer 5 in the fifth manner of potential holding unit shown in FIG. 8 will be described. FIGS. 9 and 10 are partially enlarged cross sectional views showing two kinds of manners of a cross section taken along a line B—B of FIG. 8.

Referring to FIG. 9, a field oxide film 43 is formed in the boundary portion between first p well 36 and n well 37 on the main surface of semiconductor substrate 1. A field oxide film 44 is formed in the boundary portion between n well 36 and second p well 38. In this case, conductive layer 5 is formed on field oxide film 43.

As shown in FIG. 8, conductive layer 5 is electrically connected to n well 37 by potential holding unit 15. As a result, it is possible to hold the potential of conductive layer 5 at the same potential as n well 37, that is, the ground potential. As shown in FIG. 10, conductive layer 5 may also be formed on field oxide film 44. In this case, conductive layer is also electrically connected to n well 37 by potential holding unit 15. As a result, the potential of conductive layer 5 is held at a predetermined potential, resulting in protection of memory cell array region 12 from the external noise.

Figure 17:
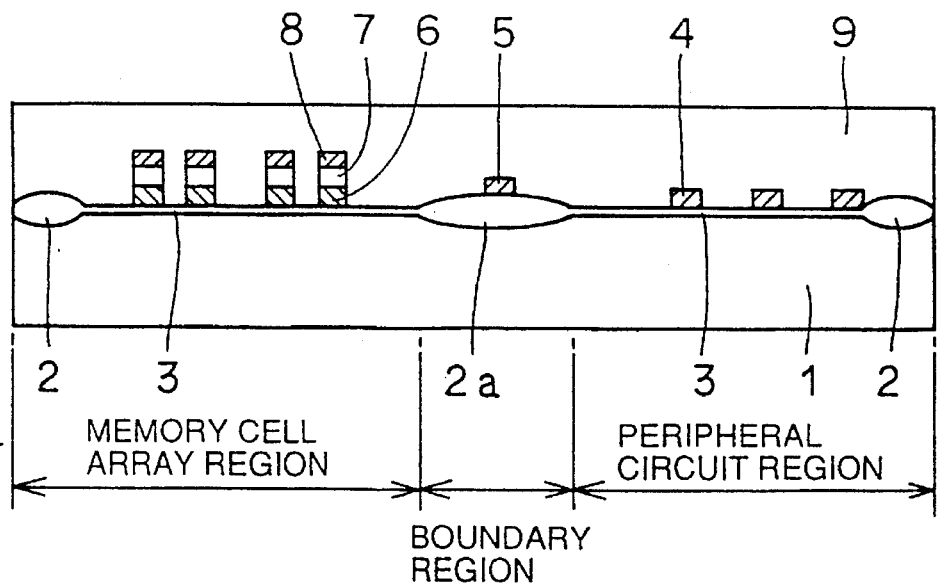
Figure 18:
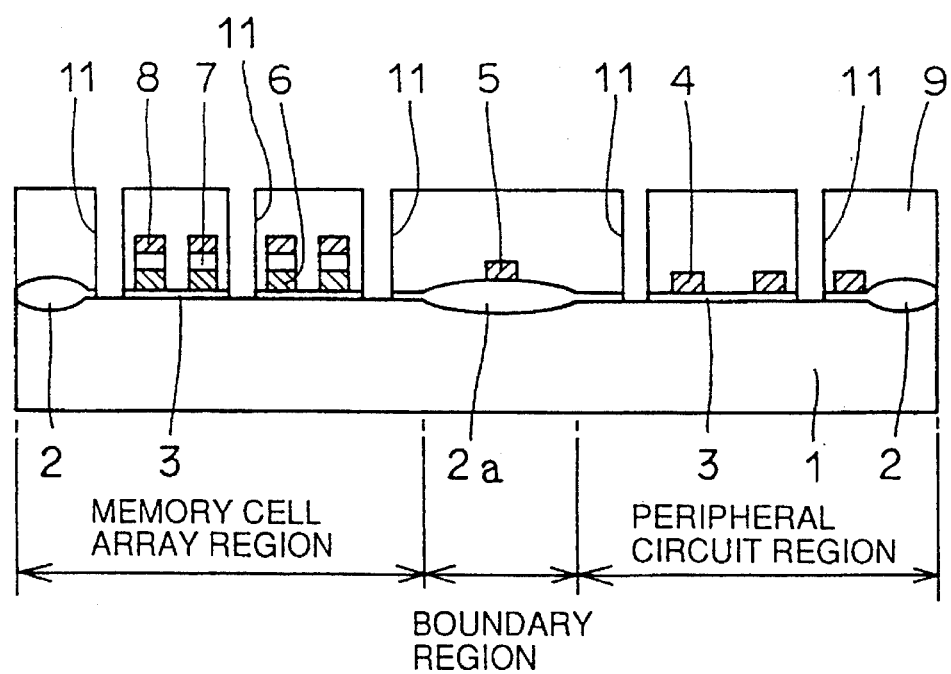
Figure 19:
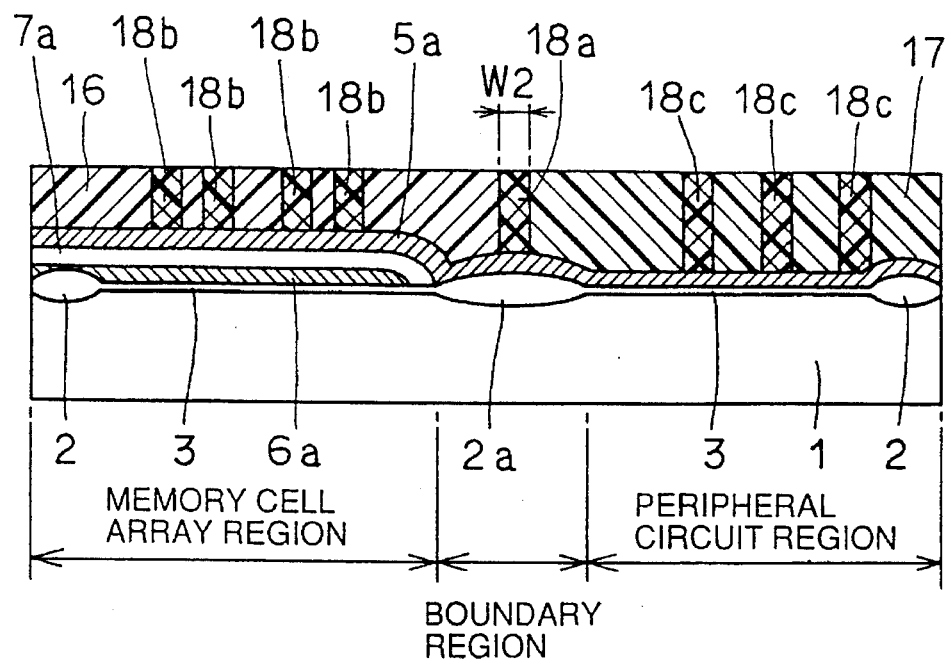
FIG. 19 is a cross sectional view showing the manner in which the first mask layer is positioned over the second mask layer according to the present invention.

Referring to FIGS. 11 to 19, an example of a method of manufacturing the semiconductor memory device having a structure shown in FIG. 1 will now be described. FIGS. 11 to 18 are partial cross sectional views showing the first to the eighth steps of the manufacturing process of the semiconductor memory device according to the first embodiment of the present invention. FIG. 19 is a partial cross sectional view showing the manner in which mask layer 16 is positioned over mask layer 17 in the method of manufacturing the semiconductor memory device according to the present invention.

Figure 11:
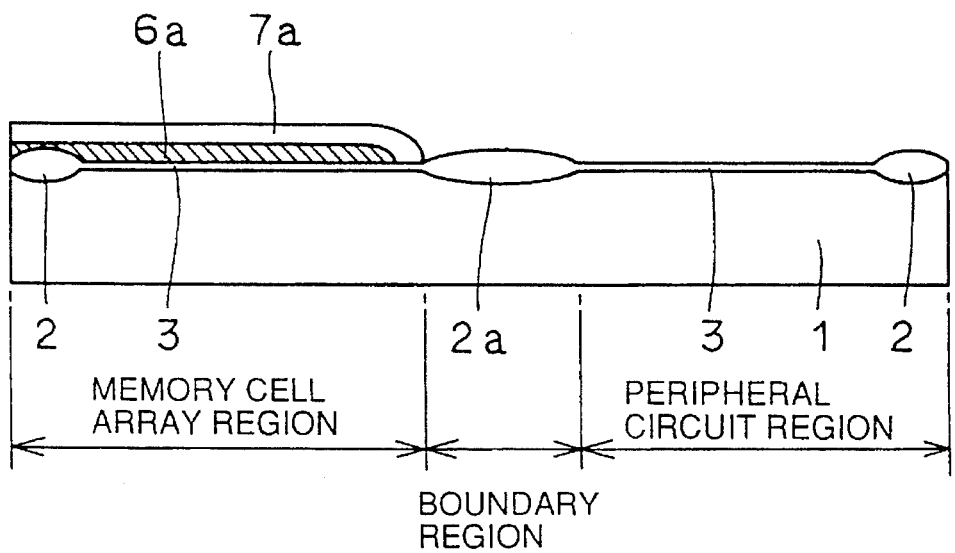
FIGS. 11 to 18 are partial cross sectional views showing the first to the eighth steps of the manufacturing process of the semiconductor memory device according to the first embodiment of the present invention.

Referring to FIG. 11, via the steps similar to the conventional steps, field oxide films 2, 2a are spaced on the main surface of semiconductor substrate 1. After forming gate insulating film 3 on the entire main surface of semiconductor substrate 1, a first conductive layer 6a of poly-crystalline silicon or the like having the film thickness of approximately 1000Å to 1500Å is formed on gate insulating film 3 in the memory cell array region. An insulating layer 7a of a silicon oxide film or in a combined structure of a silicon oxide film and a silicon nitride film having the film thickness of approximately 300 Å is formed on first conductive layer 6a.

Figure 12:
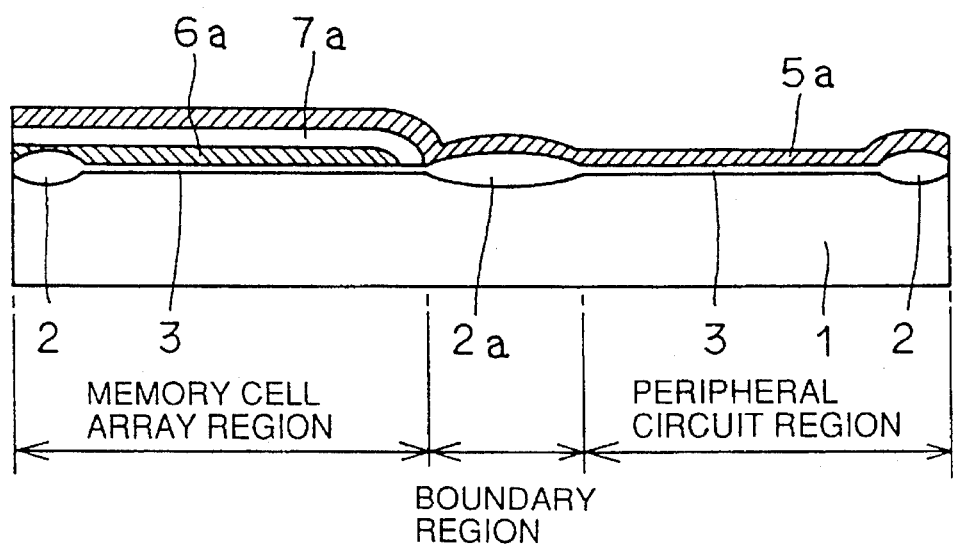
Figure 13:
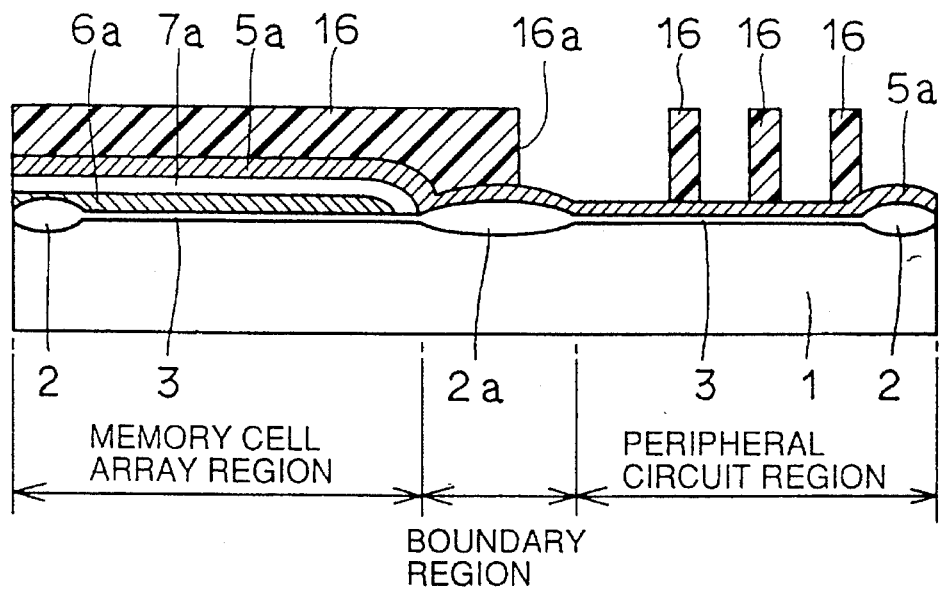

Referring to FIG. 12, using the CVD method or the like, a second conductive layer 5a of poly-crystalline silicon or the like having the film thickness of approximately 2000Å to 3000Å is formed on the entire main surface of semiconductor substrate 1. First mask layer 16 of resist or the like is applied to second conductive layer 5a. As shown in FIG. 13, first mask layer 16 is patterned to have a portion covering the memory cell array region and having an end portion 16a on field oxide film 2a in the boundary region, and portions selectively formed on the peripheral circuit region.

Figure 14:
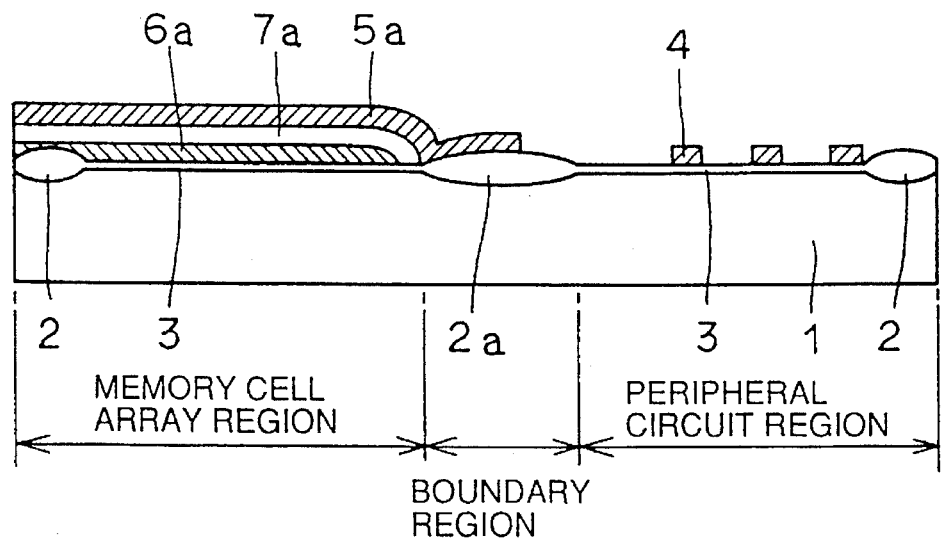

Referring to FIG. 14, by applying an etching process with first mask layer 16 used as a mask, second conductive layer 5a on the peripheral circuit region is patterned. As a result, gate electrode 4 is formed in the peripheral circuit region. Then, second mask layer 17 of resist or the like is applied to the entire main surface of semiconductor substrate 1. Then, second mask layer 17 is patterned to a predetermined shape.

Figure 15:
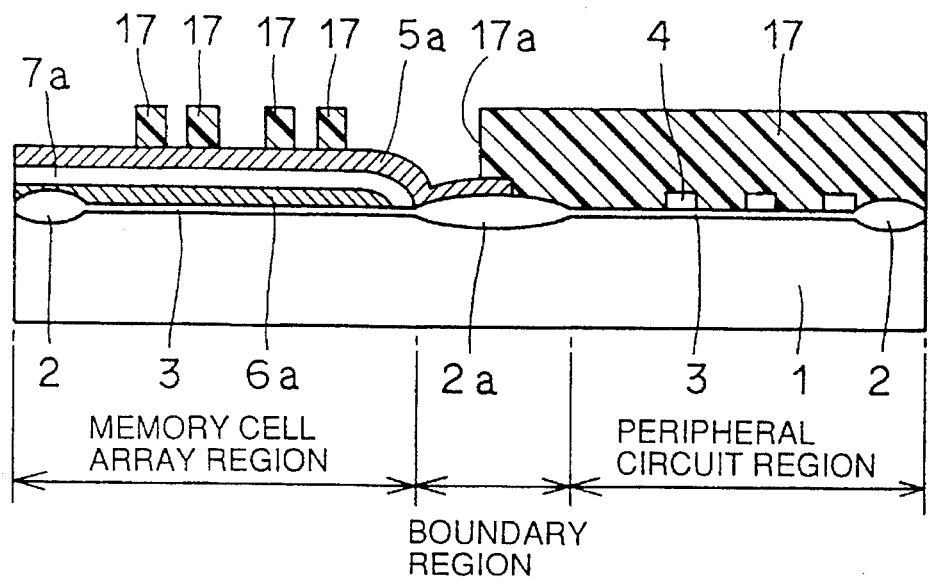

As a result, as shown in FIG. 15, second mask layer 17 is patterned to have a portion covering the peripheral circuit region and having an end portion 17a on field oxide film 2a formed in the boundary region, and portions selectively formed on the memory cell region. At this time, end portion 17a positioned on field oxide film 2a formed in the boundary region of second mask layer 17 is formed so as to cover part of second conductive layer 5a, as shown in FIG. 15.

Figure 16:
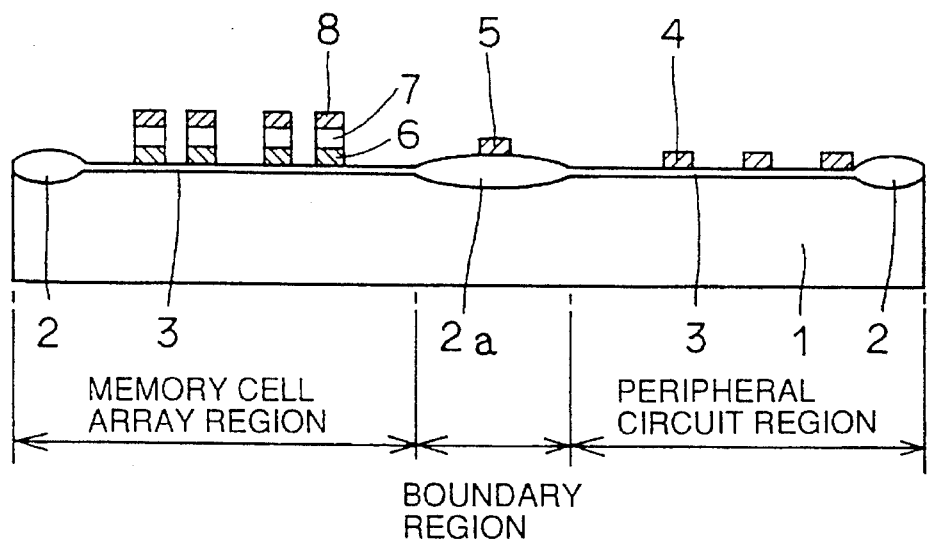

In this state, second conductive layer 5a, insulating layer 7a and first conductive layer 6a in the memory cell array region are sequentially patterned. As a result, as shown in FIG. 16, part of conductive layer 5a is left on field oxide film 2a in the boundary region, resulting in formation of conductive layer 5 on field oxide film 2a. By leaving conductive layer 5 on field oxide film 2a, it is possible to avoid formation of a concave portion on the surface of field oxide film 2a positioned in the boundary region, as in the conventional case.

The reason why the concave portion is not formed on the surface of field oxide film 2a will be described. Referring to FIG. 15, end portion 17a positioned on the boundary region of second mask layer 17 covers part of second conductive layer 5a, as described above. Therefore, no part of the surface of isolation oxide film 2a formed in the boundary region is not exposed at this time. As a result, it is possible to effectively prevent formation of the concave portion on the surface of field oxide film 2a in the succeeding etching step caused by part of the surface of field oxide film 2a in the boundary region exposed at the time of patterning of the second mask layer, as in the conventional case. Then, it is possible to avoid problems such as disconnection of the upper interconnection caused by the concave portion, which has been conventionally problematic.

A width W2 of the portion where first mask layer 16 is positioned over second mask layer 17 in the boundary region will be described with reference to FIG. 19. Referring to FIG. 19, when first mask layer 16 is formed over second mask layer 17 according to the present invention, on the memory cell array region or on the peripheral circuit region, portions 18b, 18c exist where first mask layer 16 is positioned over second mask layer 17, as similar to the conventional example.

However, in the case of the present invention, a portion 18a where first mask layer 16 is positioned over second mask layer 17 exists also in the boundary region. By formation of first and second mask layers 16, 17 in positions where they overlap with each other on field oxide film 2a in the boundary region, it is possible to form conductive layer 5 in a portion positioned beneath portion 18a.

It is preferred that the plan width W2 of portion 18a is at least the sum of the plan minimal dimension of the interconnection layer in the semiconductor chip and the amount of overlap of two mask layers (first mask layer 16 and second mask layer 17). More specifically, when the minimal dimension of the interconnection layer is approximately 0.5 μm, and the amount of overlap of two mask layers 16, 17 is approximately 0.1 μm, the value of the width W2 may be at least approximately 0.6 μm. As a result, it is possible to form conductive layer 5 which may be left on field oxide film 2a without being separated therefrom.

After formation of conductive layer 5 on field oxide film 2a in the boundary region, as described above, interlayer insulating film 9 is formed on the entire main surface of semiconductor substrate 1 by using the CVD method or the like, as shown in FIG. 17. A contact hole 11 is formed at a predetermined portion of interlayer insulating film 9, as shown in FIG. 18. Then, interconnection layer 10 of aluminum (Al) or the like is selectively formed on interlayer insulating film 9 including the inner surface of contact hole 11. The semiconductor memory device shown in FIG. 1 can be obtained via steps described above.

Referring to FIGS. 20 to 24, a semiconductor memory device according to the second embodiment of the present invention will be described. FIGS. 20 to 24 are partial cross sectional views showing the first to the fifth steps of the manufacturing process of the semiconductor memory device according to the second embodiment of the present invention.

Figure 20:
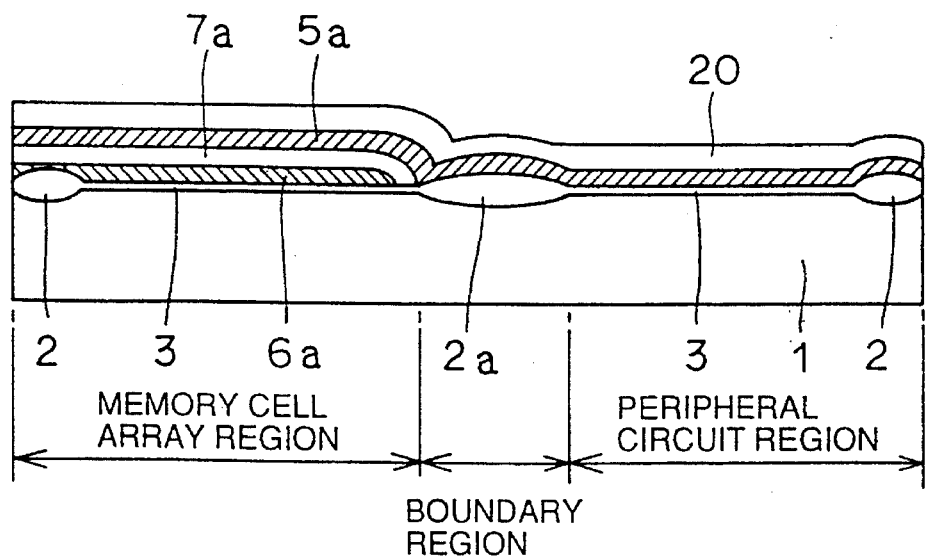
FIGS. 20 to 24 are partial cross sectional views showing the first to the fifth steps of the manufacturing process of the semiconductor memory device according to a second embodiment of the present invention.

Referring to FIG. 20, via the steps similar to those of the first embodiment, field oxide films 2, 2a, gate insulating film 3, first conductive layer 6a, insulating layer 7a, and second conductive layer 5a are respectively formed. An insulating layer 20 of a silicon oxide film or the like is formed on second conductive layer 5a by using the CVD method or the like. In this embodiment, insulating layer 20, which will serve as an interlayer insulating film, is formed in advance on second conductive layer 5a.

Figure 21:
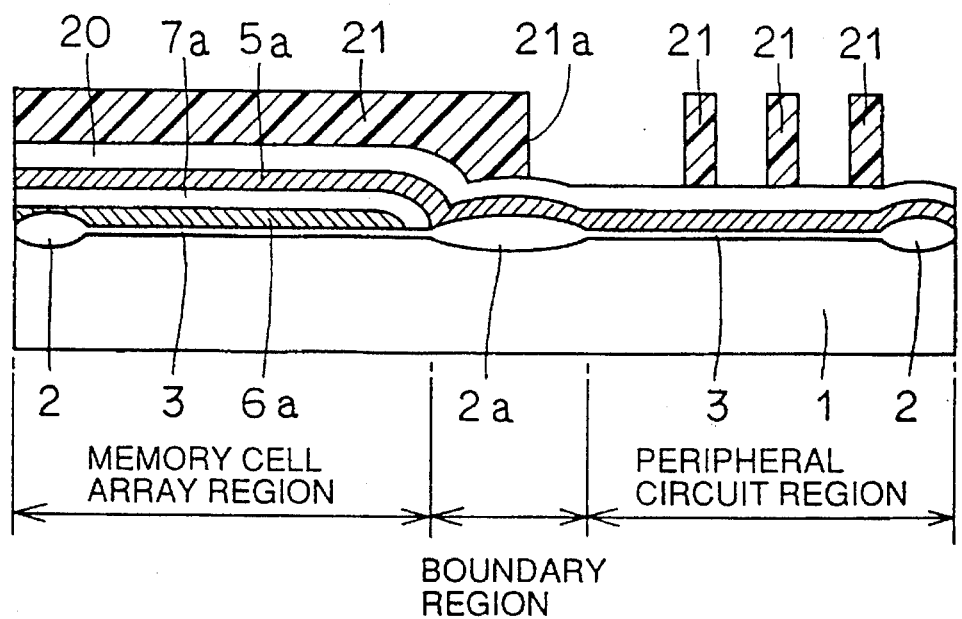
Figure 22:
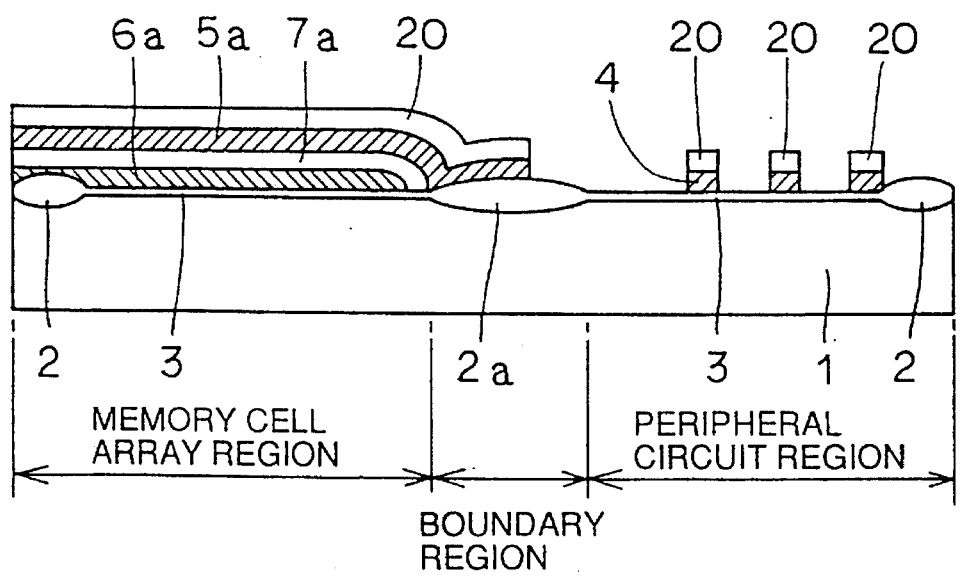

Referring to FIG. 21, a first mask layer 21 of resist or the like is formed on insulating layer 20. First mask layer 21 has an end portion 21a formed on field oxide film 2a in the boundary region, similar to first mask layer 16 in the first embodiment. As shown in FIG. 22, second conductive layer 5a and insulating layer 20 in the peripheral circuit region are patterned with first mask layer 21 used as a mask. As a result, gate electrode 4 is formed in the peripheral circuit region.

Figure 23:
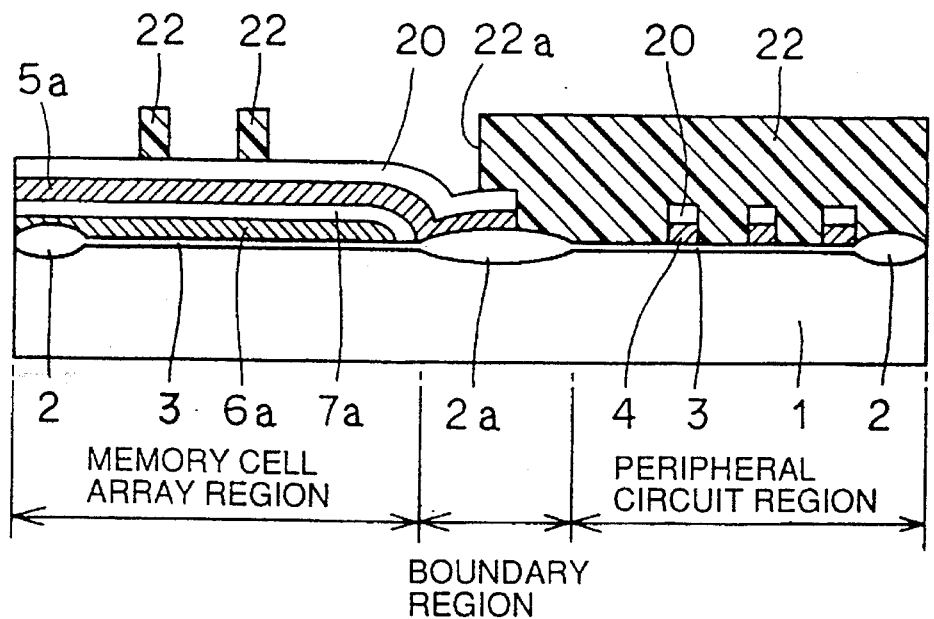

Referring to FIG. 23, a second mask layer 22 having an end portion 22a on field oxide film 2a is formed so as to cover part of second conductive layer 5a and insulating layer 20 on field oxide film 2a in the boundary region. At this time, it is preferred that a plan width of a portion covering second conductive layer 5a and insulating film 20 positioned on field oxide film 2a of second mask layer 22 is substantially the same as the plan width W2 of portion 18a in which first mask layer 16 is positioned over second mask layer 17 in the first embodiment.

Figure 24:
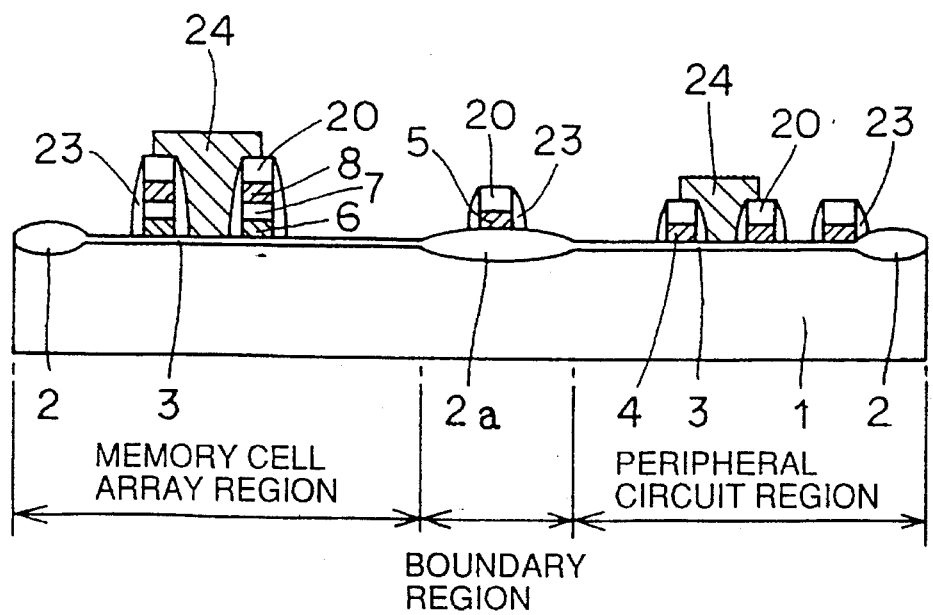
Figure 25:
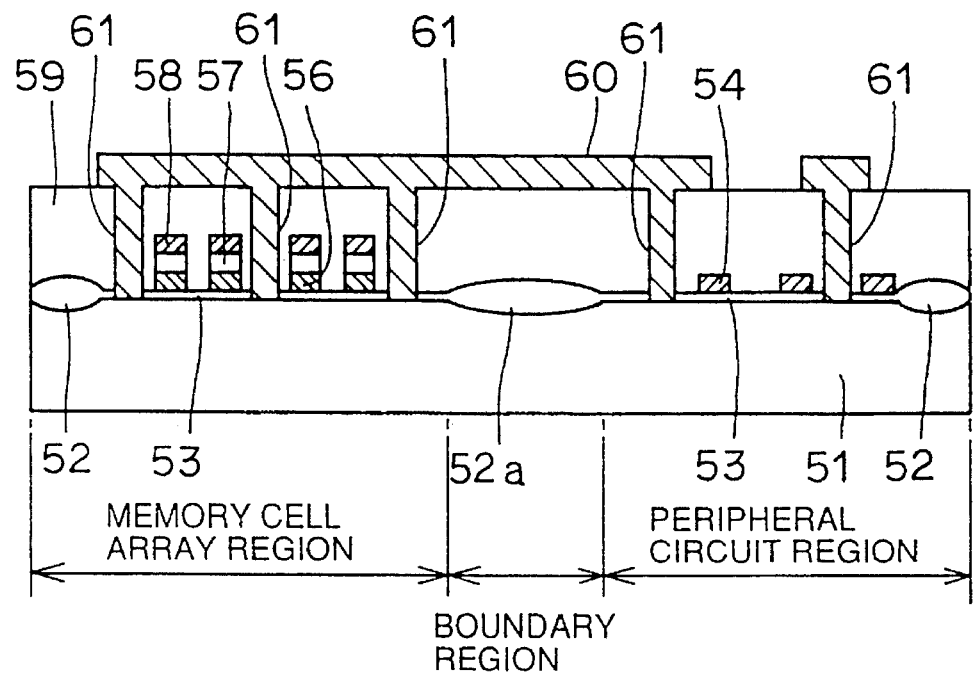
FIG. 25 is a partial cross sectional view showing an example (EPROM) of a conventional semiconductor memory device.
Figure 26:
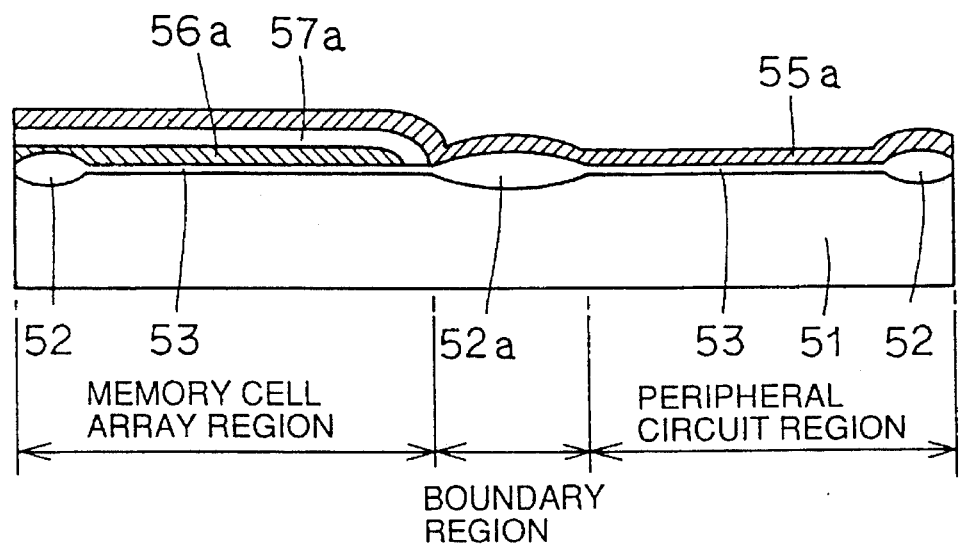
FIGS. 26 to 30 are partial cross sectional views showing the first to the fifth steps of the manufacturing process of the conventional semiconductor memory device.
Figure 27:
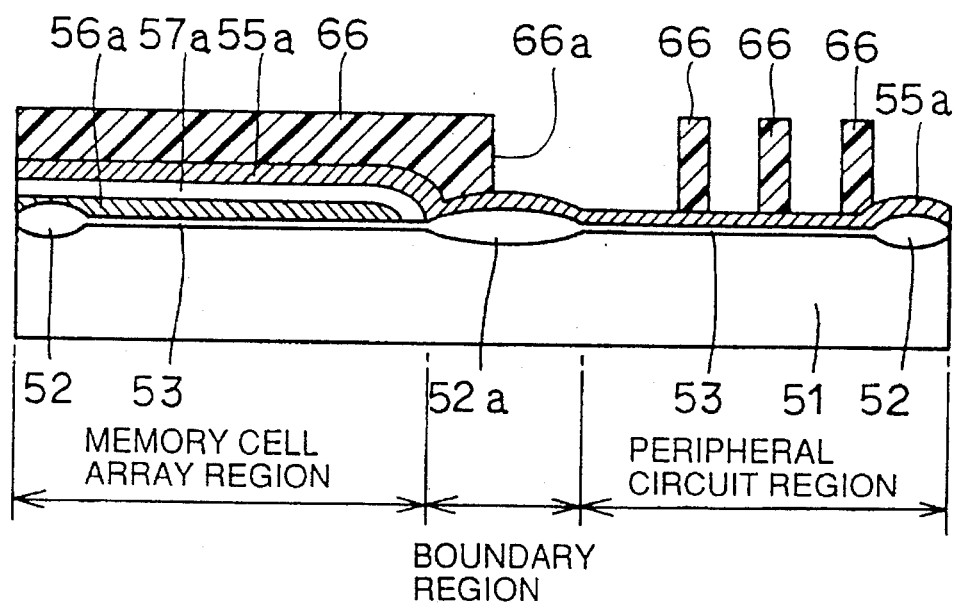
Figure 28:
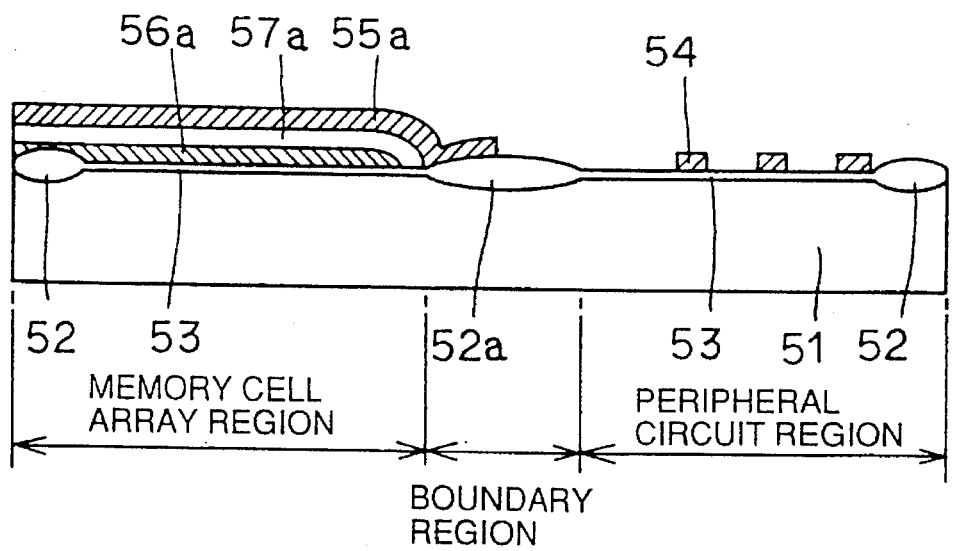
Figure 29:
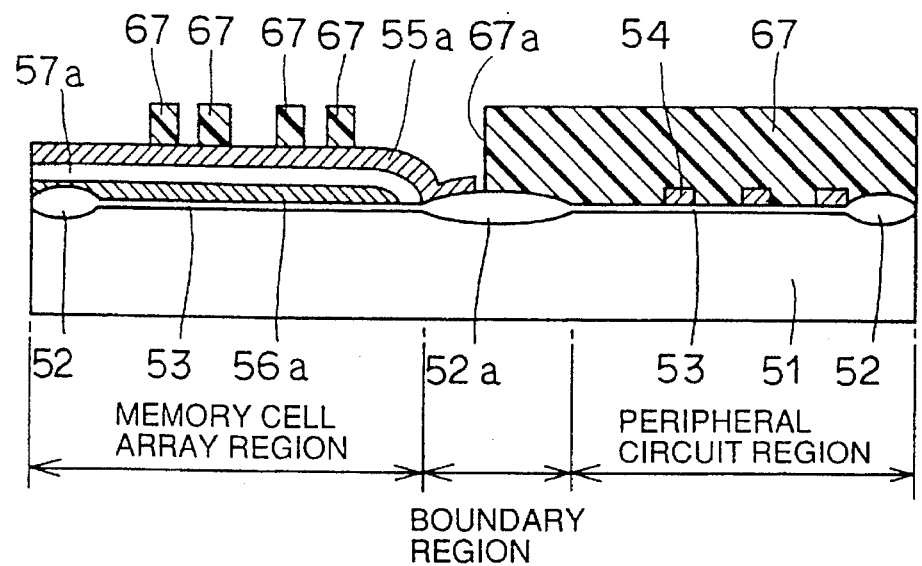
Figure 30:
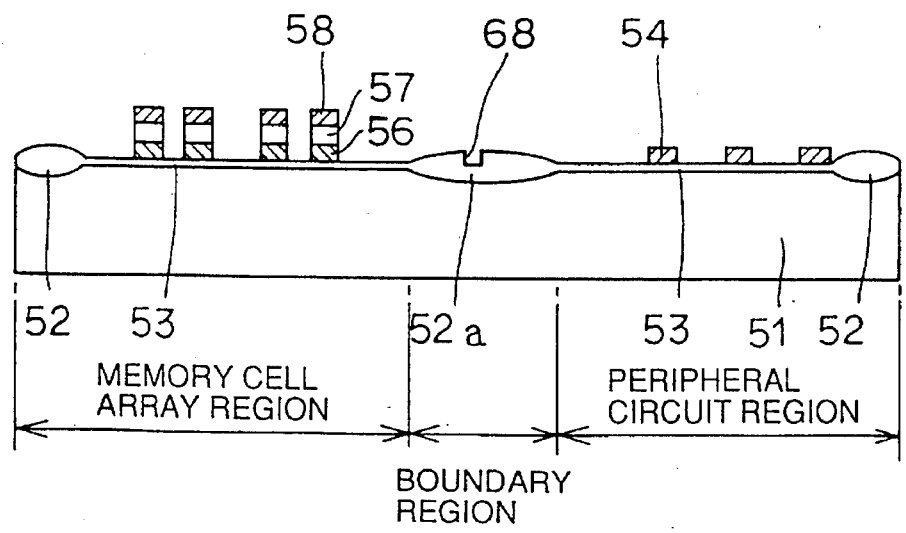
Figure 31:
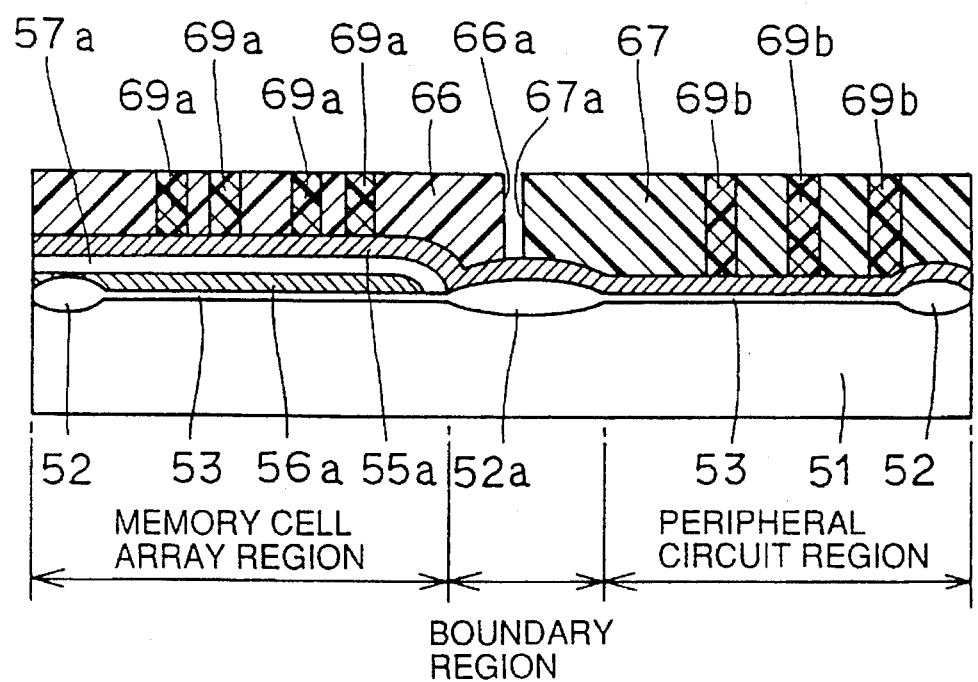
FIG. 31 is a cross sectional view showing the manner in which a first mask layer is positioned over a second mask layer in manufacturing the conventional semiconductor memory device.

First conductive layer 6a, insulating layer 7a, and second conductive layer 5a formed in the memory cell array region are patterned to a predetermined shape with second mask layer 22 used as a mask. As a result, floating gate electrode 6, interlayer insulating film 7, and control gate electrode 8 are formed. At this time, since end portion 22a positioned on field oxide film 2a of second mask layer 22 is formed on second conductive layer 5a and on insulating layer 20, second conductive layer 5a is left on field oxide film 2a. Therefore, as shown in FIG. 24, it is possible to form conductive layer 5 on field oxide film 2a.

After completion of patterning of floating gate electrode 6, interlayer insulating film 7, and control gate electrode 8, as described above, an insulating film is formed on the entire surface of semiconductor substrate 1 by using again the CVD method or the like. By applying an anisotropic etching process to the insulating film, a sidewall 23 is formed on the sidewall Of gate electrode 4, the sidewall of conductive layer 5, or the sidewalls of floating gate electrode 6 and control gate electrode 8. Then, an aluminum (Al) film is formed by using the sputtering method or the like. By patterning the aluminum film to a predetermined shape, an interconnection layer 24 is formed.

A semiconductor memory device having a memory transistor of a stacked structure of a control gate electrode and a floating gate electrode in a memory cell array region was described in each of the above-described embodiments. However, the present invention is not limited thereto, but may be applied to the other semiconductor memory devices such as DRAM having a memory array region, a peripheral circuit region, and a boundary region therebetween.

As described above, according to the semiconductor memory device of the present invention, it is possible to form a conductive layer so as to surround a memory cell array region. As a result, it is possible to protect the memory cell array region from the external noise, resulting in provision of a semiconductor memory device of higher reliability.

According to the method of manufacturing the semiconductor memory device of the present invention, the second mask layer is formed so as to cover the end portion of the second conductive layer on the isolation oxide film in the boundary region. Therefore, it is possible to prevent exposure of part of the surface of the isolation oxide film at the time of formation of the second mask layer. As a result, it is possible to prevent formation of the concave portion on the surface of the isolation oxide film formed in the boundary region when applying an etching process with the second mask layer used as a mask. It is possible to avoid problems such as disconnection of the upper interconnection layer, or occurrence of leakage current caused by exposure of the semiconductor substrate by separation of the isolation oxide film in the worst case. As a result, it is possible to provide a semiconductor memory device of high reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor memory device including, on a semiconductor substrate, a memory cell array region for storing information, a peripheral circuit region for carrying out an operation control of said memory cell array region, and an isolation oxide film provided in a boundary region between said memory cell array region and said peripheral circuit region, comprising the steps of:

sequentially forming a first conductive layer and an insulating layer on said semiconductor substrate in said memory cell array region;

forming a second conductive layer on said insulating layer, on said isolation oxide film, and on said peripheral circuit region;

patterning said second conductive layer on said peripheral circuit region to a first shape with the second conductive layer formed on said memory cell array region and on said isolation oxide film covered with a first mask layer;

removing said first mask layer;

sequentially etching said second conductive layer, said insulating layer, and said first conductive layer in said memory cell region to pattern the same to a second shape with said second conductive layer on said isolation oxide film and said peripheral circuit region covered with a second mask layer; and removing said second mask layer.

2. The method as recited in claim 1, wherein a plan width of said second conductive layer on said isolation oxide film covered with said second mask layer is at least the same as a plan width of said second conductive layer patterned in said memory cell array region.

3. The method as recited in claim 1, wherein the plan width of said second conductive layer on said isolation oxide film covered with said second mask layer is at least approximately 0.6 μm.

4. The method as recited in claim 1, further comprising the step of forming potential holding means for holding a potential of said second conductive layer which is left on said isolation oxide film after said removal of said second mask at a potential.

5. The method as recited in claim 1, wherein the step of forming said first mask layer includes the step of forming an insulating layer on said second conductive layer.

* * * * *